(12) United States Patent
Ito

(10) Patent No.: US 10,838,263 B2
(45) Date of Patent: Nov. 17, 2020

(54) ELECTRO-OPTICAL DEVICE AND ELECTRONIC APPARATUS

(71) Applicant: SEIKO EPSON CORPORATION, Tokyo (JP)

(72) Inventor: Satoshi Ito, Eniwa (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 16/445,697

(22) Filed: Jun. 19, 2019

(65) Prior Publication Data

US 2019/0391424 A1 Dec. 26, 2019

(30) Foreign Application Priority Data

Jun. 20, 2018 (JP) ................... 2018-117180

(51) Int. Cl.
*G02F 1/1343* (2006.01)
*G02F 1/1362* (2006.01)
*G02F 1/1337* (2006.01)
*G02F 1/1335* (2006.01)

(52) U.S. Cl.
CPC ........ *G02F 1/1343* (2013.01); *G02F 1/13624* (2013.01); *G02F 1/133512* (2013.01); *G02F 1/133711* (2013.01)

(58) Field of Classification Search
None
See application file for complete search history.

(56) References Cited

U.S. PATENT DOCUMENTS

| 5,760,861 | A | * | 6/1998 | Kim | .................. | G02F 1/136209 |
|---|---|---|---|---|---|---|
| | | | | | | 349/110 |
| 9,671,634 | B2 | * | 6/2017 | Sato | .................. | G02F 1/133351 |
| 2003/0025848 | A1 | * | 2/2003 | Sera | .................. | G02F 1/136209 |
| | | | | | | 349/43 |
| 2003/0076459 | A1 | * | 4/2003 | Murade | ............. | G02F 1/133512 |
| | | | | | | 349/111 |
| 2006/0145281 | A1 | * | 7/2006 | Jiroku | ............... | G02F 1/133512 |
| | | | | | | 257/435 |
| 2006/0152665 | A1 | | 7/2006 | Murade | | |
| 2006/0209222 | A1 | * | 9/2006 | Yasuda | ............. | G02F 1/136286 |
| | | | | | | 349/43 |
| 2007/0206147 | A1 | | 9/2007 | Murade | | |

(Continued)

FOREIGN PATENT DOCUMENTS

| JP | 2000-258797 A | 9/2000 |
|---|---|---|
| JP | 2001-257355 A | 9/2001 |

(Continued)

*Primary Examiner* — Ryan Crockett
(74) *Attorney, Agent, or Firm* — Oliff PLC

(57) ABSTRACT

An electro-optical device includes a substrate that is light-transmissive, a pixel electrode that is light-transmissive, a switching element electrically coupled to the pixel electrode, and a light-shielding layer in contact with the substrate and overlapping, in a plan view from a thickness direction of the substrate, with the switching element, wherein the light-shielding layer includes a first portion and a second portion, the second portion having a thickness thicker than a thickness of the first portion. In addition, the substrate is preferably provided with a recessed portion in which the light-shielding layer is disposed, the recessed portion opening to the switching element side.

8 Claims, 12 Drawing Sheets

(56) References Cited

U.S. PATENT DOCUMENTS

| | | | |
|---|---|---|---|
| 2008/0198314 A1 | 8/2008 | Murade | |
| 2010/0327328 A1* | 12/2010 | Yamada | H01L 27/14625 257/225 |
| 2011/0180798 A1* | 7/2011 | Shim | G02F 1/133514 257/59 |
| 2013/0201429 A1* | 8/2013 | Xu | G02F 1/133512 349/95 |
| 2015/0103284 A1* | 4/2015 | Nagasawa | G02F 1/136227 349/46 |
| 2016/0035774 A1* | 2/2016 | Noh | H01L 27/14614 257/229 |
| 2016/0342046 A1* | 11/2016 | Wu | G02F 1/13394 |
| 2017/0123250 A1* | 5/2017 | Wada | G02F 1/1368 |
| 2017/0255068 A1* | 9/2017 | Wu | G02F 1/133345 |
| 2018/0188581 A1* | 7/2018 | Peng | G06F 3/0412 |
| 2018/0294360 A1* | 10/2018 | Zhang | C09D 183/08 |
| 2019/0198674 A1* | 6/2019 | Ozeki | H01L 29/78645 |

FOREIGN PATENT DOCUMENTS

| | | | |
|---|---|---|---|
| JP | 2001-281645 A | 10/2001 | |
| JP | 2003-177428 A | 6/2003 | |
| JP | 2005-250234 A | 9/2005 | |
| JP | 2006-190836 A | 7/2006 | |
| JP | 2008-225034 A | 9/2008 | |

\* cited by examiner

ELECTRO-OPTICAL DEVICE AND ELECTRONIC APPARATUS

The present application is based on and claims priority from JP Application Serial Number 2018-117180, filed on Jun. 20, 2018, the disclosure of which is hereby incorporated by reference herein in its entirety.

BACKGROUND

1. Technical Field

The present disclosure relates to an electro-optical device and an electronic apparatus.

2. Related Art

An electro-optical device such as a liquid crystal device is used in an electronic apparatus such as a projector. JP-A-2005-250234 discloses an electro-optical device including an element substrate, a counter substrate, and liquid crystals disposed between these substrates.

The element substrate disclosed in JP-A-2005-250234 includes a quartz substrate, a plurality of pixel electrodes arranged in a matrix manner to be spaced apart from the quartz substrate, a thin film transistor (TFT) provided to correspond to each of the pixel electrodes. In addition, the element substrate described in JP-A-2005-250234 includes a light shielding film made, for example, of metal to prevent light from entering the TFT.

In the case of the light shielding film described in JP-A-2005-250234, it may be considered to increase the thickness of the light shielding film to enhance the light shielding property. However, in the case of the element substrate described in JP-A-2005-250234, if the thickness of the light shielding film is configured to be uniformly thick, the stress occurring in the substrate excessively increases. This leads to occurrence of troubles such as warpage of the substrate and crack of the light shielding film. Thus, the known element substrate has a problem in that it is difficult to enhance the light shielding property for the TFT while reducing occurrence of such a trouble.

SUMMARY

One aspect of an electro-optical device according to the present disclosure includes a substrate that is light-transmissive, a pixel electrode that is light-transmissive, a switching element electrically coupled to the pixel electrode, and a light-shielding layer in contact with the substrate and overlapping, in a plan view from a thickness direction of the substrate, with the switching element, wherein the light-shielding layer includes a first portion and a second portion, the second portion having a thickness thicker than a thickness of the first portion.

DESCRIPTION OF EXEMPLARY EMBODIMENTS

Figure 1:
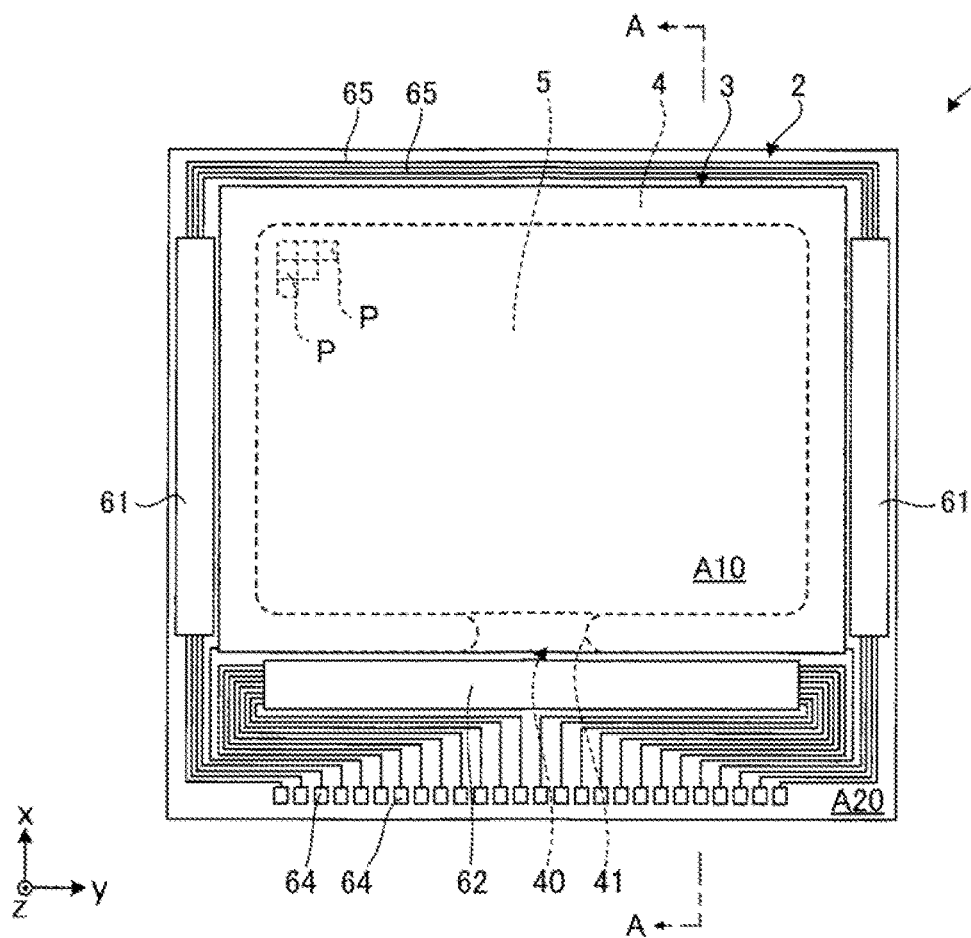
FIG. 1 is a plan view illustrating a liquid crystal device serving as one example of an electro-optical device according to a first exemplary embodiment.

Hereinafter, preferred exemplary embodiments of the present disclosure will be described with reference to the accompanying drawings. Note that, in the drawings, dimensions and scales of respective portions may be illustrated differently from actual dimensions and scales as appropriate, and some portions are schematically illustrated to facilitate understanding. In addition, the scope of the present disclosure is not limited to these exemplary embodiments unless otherwise stated to limit the present disclosure in the following descriptions. Note that, in the present specification, "parallel" does not only include a case where two planes or two lines are completely parallel to each other but also includes a case where one of two planes or two lines is angled relative to the other line within a range of ±5°.

1. Liquid Crystal Device

1-1. First Exemplary Embodiment

As one example of an electro-optical device according to the present disclosure, description will be made of, as an example, an active matrix liquid crystal device including a thin film transistor (TFT) serving as a switching element.

1-1a. Basic Configuration

Figure 2:
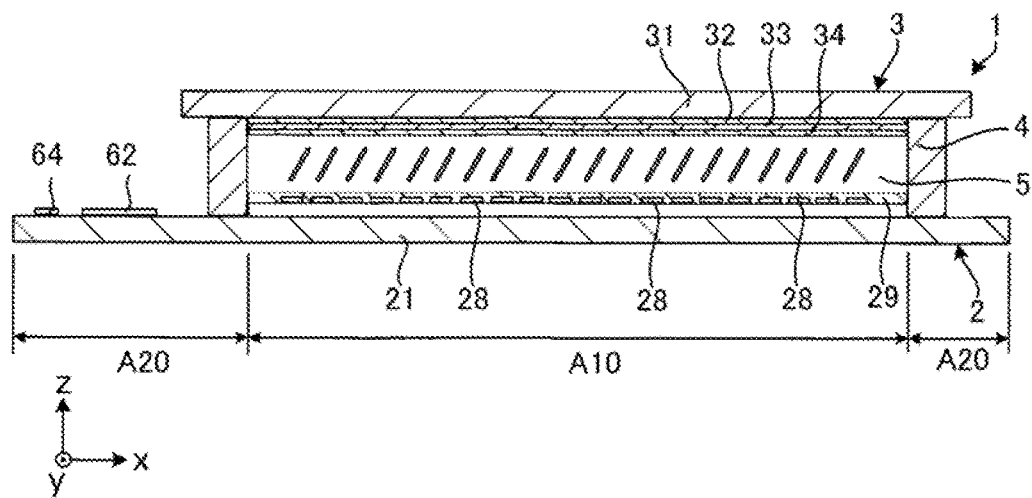
FIG. 2 is a cross-sectional view illustrating a liquid crystal device according to the first exemplary embodiment.

FIG. 1 is a plan view illustrating a liquid crystal device serving as one example of an electro-optical device according to a first exemplary embodiment. FIG. 2 is a cross-sectional view illustrating the liquid crystal device according to the first exemplary embodiment, and is a cross-sectional view taken along the line A-A in FIG. 1. Note that, hereinbelow, for the purpose of explanation, description will be made using the x axis, the y axis, and the z axis as appropriate, which are illustrated in FIGS. 1 and 2 and are perpendicular to each other.

The electro-optical device 1 illustrated in FIGS. 1 and 2 is a transmissive liquid crystal device. The electro-optical device 1 includes an element substrate 2 having a light-transmissive property, a counter substrate 3 having a light-transmissive property disposed to face the element substrate 2, a sealing member 4 having a frame shape disposed between the element substrate 2 and the counter substrate 3, and a liquid crystal layer 5 surrounded by the element substrate 2, the counter substrate 3, and the sealing member 4.

The light that passes through the electro-optical device 1 is a visible light. The light-transmissive property means a transmissive property concerning the visible light, and preferably means that the transmittance for the visible light is equal to or greater than 50%.

As illustrated in FIG. 1, the electro-optical device 1 forms a quadrilateral shape in a plan view when viewed from the z-axis direction parallel to the thickness direction of the element substrate 2. However, the shape of the electro-optical device 1 in a plan view is not limited to this. The electro-optical device 1 may form, for example, a circular shape or the like. In addition, hereinbelow, the plan view when viewed from the z-axis direction parallel to the thickness direction of the element substrate 2 is simply referred to as "plan view". Note that, in the present exemplary embodiment, the z-axis direction is parallel to the optical axis of light.

As illustrated in FIG. 1, the element substrate 2 has a size encompassing the counter substrate 3 in a plan view. As illustrated in FIG. 2, the element substrate 2 includes a substrate 21, a plurality of pixel electrodes 28, and an alignment film 29. The substrate 21 is configured using a flat plate having a light-transmissive property and an insulating property. The pixel electrodes 28 are made of a transparent conductive material such as indium tin oxide (ITO) and indium zinc oxide (IZO), for example. The alignment film 29 of the element substrate 2 is located closest to the liquid crystal layer 5, and aligns liquid crystal molecules of the liquid crystal layer 5. The constituent material of the alignment film 29 includes, for example, polyimide and silicon oxide.

Furthermore, a TFT 25, a light-shielding layer 22, and the like are disposed between the substrate 21 and the pixel electrodes 28, although not illustrated in FIG. 1 or FIG. 2. The TFT 25, the light-shielding layer 22, and the like will be described later with reference to FIG. 5 and the like.

As illustrated in FIG. 2, the counter substrate 3 includes a counter-substrate substrate 31, an insulating layer 32, a common electrode 33, and an alignment film 34. The counter-substrate substrate 31, the insulating layer 32, the common electrode 33, and the alignment film 34 are arranged in this order. Of these, the alignment film 34 is located closest to the liquid crystal layer 5.

The counter-substrate substrate 31 is configured using a flat plate having a light-transmissive property and an insulating property. The counter-substrate substrate 31 is made, for example, of glass, quartz, or the like. The common electrode 33 is laminated on the counter-substrate substrate 31 via the insulating layer 32 that is formed using an insulating material having a light-transmissive property. The common electrode 33 is made of a transparent and electrically conductive material such as ITO and IZO, for example. In addition, the alignment film 34 aligns the liquid crystal molecules of the liquid crystal layer 5. The constituent material of the alignment film 34 include, for example, polyimide, silicon oxide, and the like.

The sealing member 4 is formed using an adhesive or the like containing various types of curable resins such as epoxy resin, for example. The sealing member 4 is affixed to each of the element substrate 2 and the counter substrate 3. The liquid crystal layer 5 is disposed in an area surrounded by the sealing member 4, the element substrate 2, and the counter substrate 3. Note that an injection port 41 for injecting a liquid crystal material containing liquid crystal molecules is formed in a portion of the sealing member 4, and the injection port 41 is sealed using a sealing member 40 formed using various types of resin materials.

The liquid crystal layer 5 contains liquid crystal molecules having positive or negative dielectric anisotropy. The liquid crystal layer 5 is interposed between the element substrate 2 and the counter substrate 3 such that the liquid crystal molecules are in contact with both the alignment film 29 and the alignment film 34. The alignment of the liquid crystal molecules changes according to voltage applied to the liquid crystal layer 5. The liquid crystal layer 5 modulates the light according to voltage applied, which enables grayscale display to be performed.

Furthermore, as illustrated in FIG. 1, two scan-line driving circuits 61 and one signal-line driving circuit 62 are disposed on a surface of the element substrate 2 on the counter substrate 3 side. Note that the signal-line driving circuit 62 corresponds to a "circuit" for driving the TFT 25. In addition, a plurality of external terminals 64 are disposed on the surface of the element substrate 2 on the counter substrate 3 side. The external terminals 64 are coupled to wiring lines 65 guided from each of the scan-line driving circuits 61 and the signal-line driving circuit 62.

The electro-optical device 1 includes a display region A10 that overlaps with the liquid crystal layer 5 in a plan view and displays images or the like, and also includes a peripheral region A20 that surrounds the display region A10 in a plan view. The display region A10 includes a plurality of pixels P arranged in a matrix pattern. One pixel electrode 28 is disposed on each of the pixels P. The scan-line driving circuits 61, the signal-line driving circuit 62, and the like, which are described above, are disposed in the peripheral region A20.

Furthermore, the driving scheme of the electro-optical device 1 may include, but is not limited to, a twisted nematic (TN) mode and a vertical alignment (VA) mode, for example.

1-1b. Electrical Configuration

Figure 3:
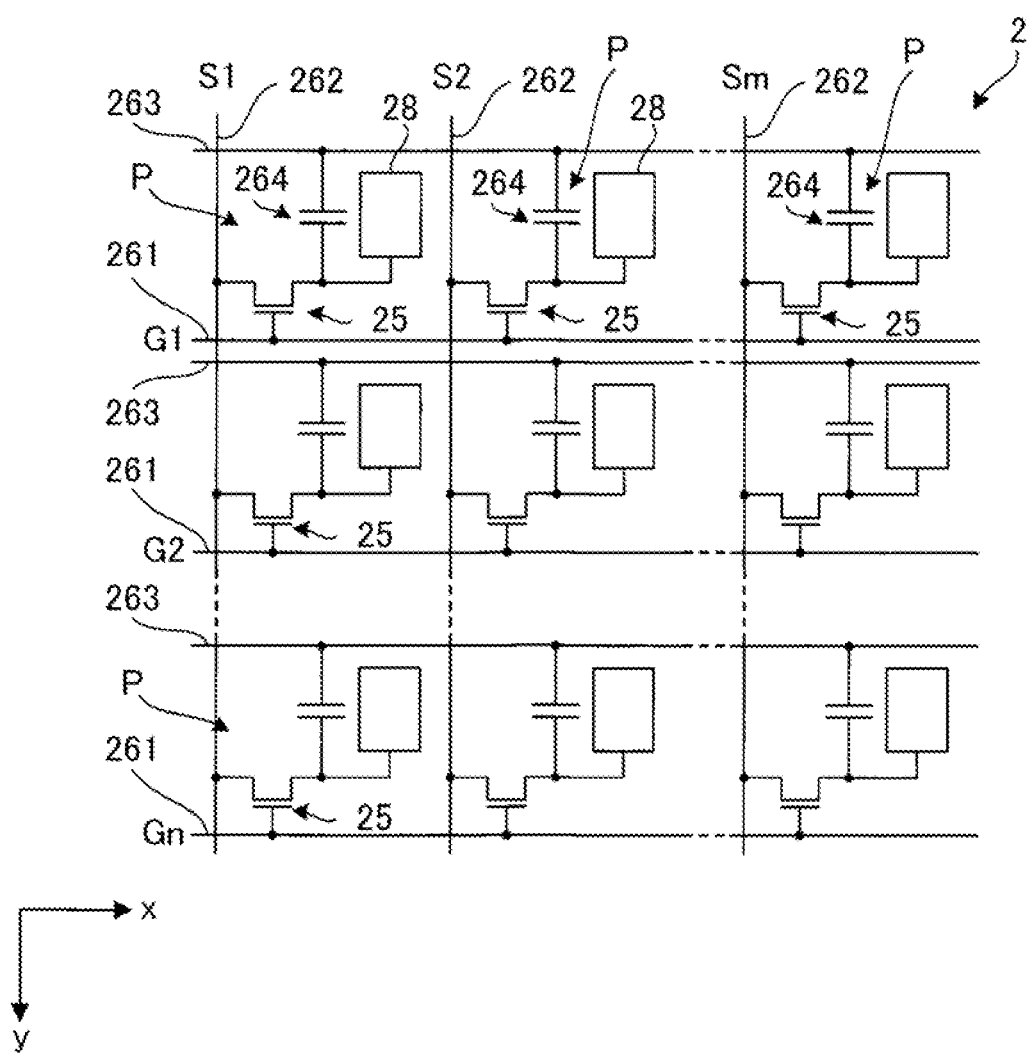
FIG. 3 is an equivalent circuit diagram illustrating an electrical configuration of an element substrate according to the first exemplary embodiment.

FIG. 3 is an equivalent circuit diagram illustrating an electrical configuration of the element substrate according to the first exemplary embodiment. As illustrated in FIG. 3, n pieces of scan lines 261, m pieces of signal lines 262, and n pieces of capacitance lines 263 are formed on the element substrate 2. Note that both n and m are integers of 2 or greater. The TFT 25 is disposed to correspond to respective intersections between the n pieces of scan lines 261 and the m pieces of signal lines 262.

The n pieces of scan lines 261 illustrated in FIG. 3 are arranged at equal intervals in the y-axis direction and extend in the x-axis direction. The scan line 261 is electrically coupled to the TFT 25. In addition, the n pieces of scan lines 261 are electrically coupled to the scan-line driving circuit 61 illustrated in FIG. 1. On the n pieces of scan lines 261, scan signals G1, G2, . . . , and Gn are line-sequentially supplied from the scan-line driving circuit 61 to the scan lines 261.

The m pieces of signal lines 262 illustrated in FIG. 3 are arranged at equal intervals in the x-axis direction and extend in the y-axis direction. The signal lines 262 is electrically coupled to the TFT 25. The m pieces of signal lines 262 are electrically coupled to the signal-line driving circuit 62 illustrated in FIG. 1. On the m pieces of signal lines 262, image signals Sl, S2, . . . , and Sm are line-sequentially supplied from the signal-line driving circuit 62 illustrated in FIG. 1 to the signal lines 262.

The n pieces of scan lines 261 and the m pieces of signal lines 262 are insulated from each other, and are formed in a lattice pattern in a plan view. An area surrounded by two adjacent scan lines 261 and two adjacent signal lines 262 corresponds to the pixel P. One pixel electrode 28 is formed on each of the pixels P. Note that the pixel electrode 28 is electrically coupled to the TFT 25.

The n pieces of capacitance lines 263 are arranged at equal intervals in the y-axis direction, and extend in the x-axis direction. In addition, the n pieces of capacitance lines 263 are insulated from the plurality of signal lines 262 and the plurality of scan lines 261, and are formed to be spaced apart from these lines. A fixed potential such as a ground potential is applied to the capacitance lines 263. Furthermore, a storage capacitor 264 is disposed between the capacitance line 263 and the pixel electrode 28 to be in parallel to a liquid crystal capacitor, to prevent leakage of charges held in the liquid crystal capacitor.

The scan signals G1, G2, . . . , and Gn become sequentially active, and n pieces of scan lines 261 are sequentially selected. Then, the TFT 25 coupled to the selected scan line 261 is turned into the ON-state. After this, image signals Sl, S2, . . . , and Sm having the magnitude corresponding to a grayscale to be displayed are transmitted, through the m pieces of signal lines 262, into the pixel P corresponding to the selected scan line 261, and are then applied to the pixel electrodes 28. This allows a voltage corresponding to the grayscale to be displayed, to be applied to the liquid crystal capacitor formed between the pixel electrode 28 and the common electrode 33 of the counter substrate 3 illustrated in FIG. 2, and the alignment of the liquid crystal molecules changes according to the applied voltage. The applied voltage is held by the storage capacitor 264. Such a change of the alignment of the liquid crystal molecules causes the light to be modulated, thereby enabling grayscale display.

1-1c. Configuration of Element Substrate in Display Region

Figure 4:
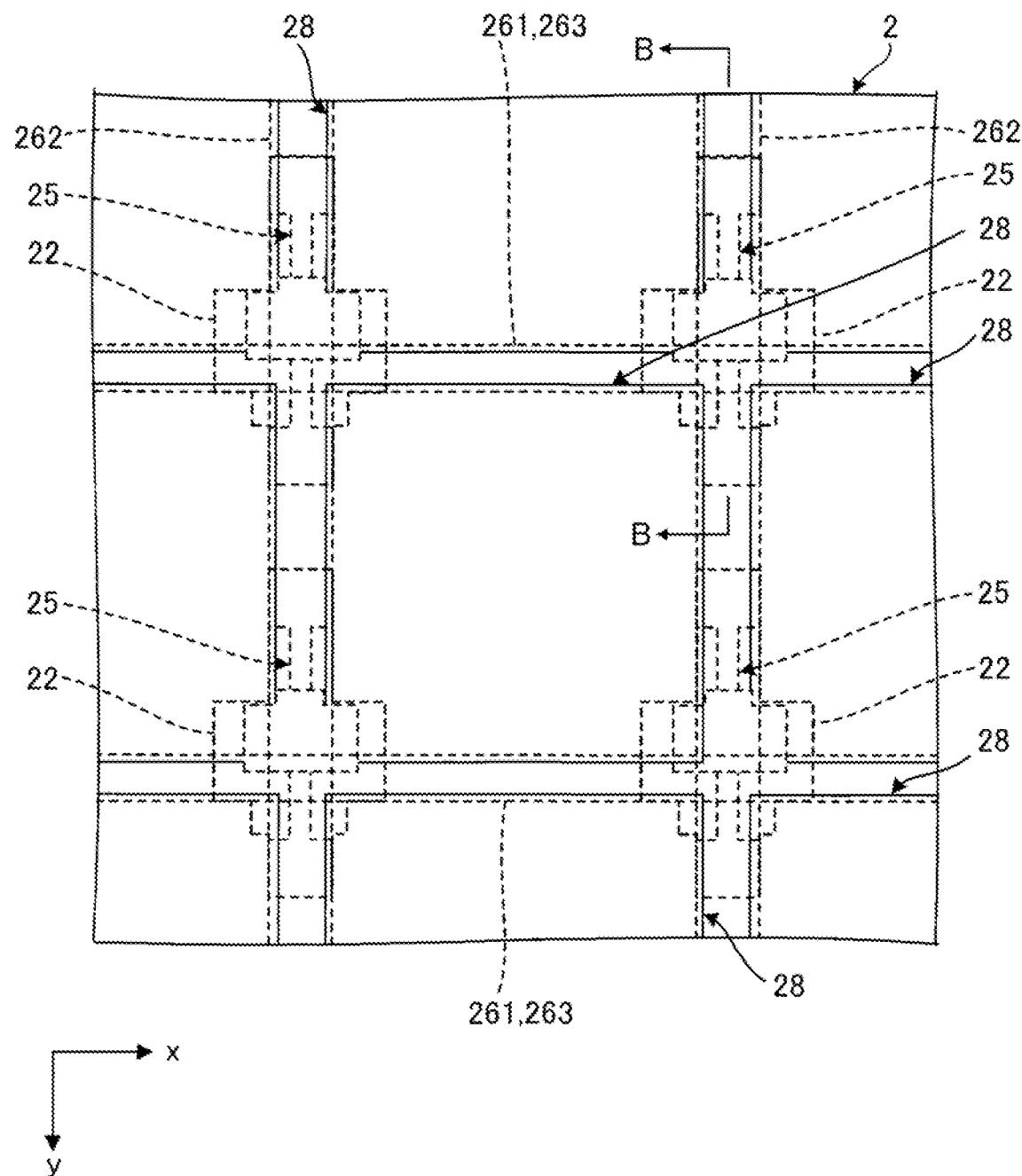
FIG. 4 is a partial plan view illustrating the element substrate according to the first exemplary embodiment.
Figure 5:
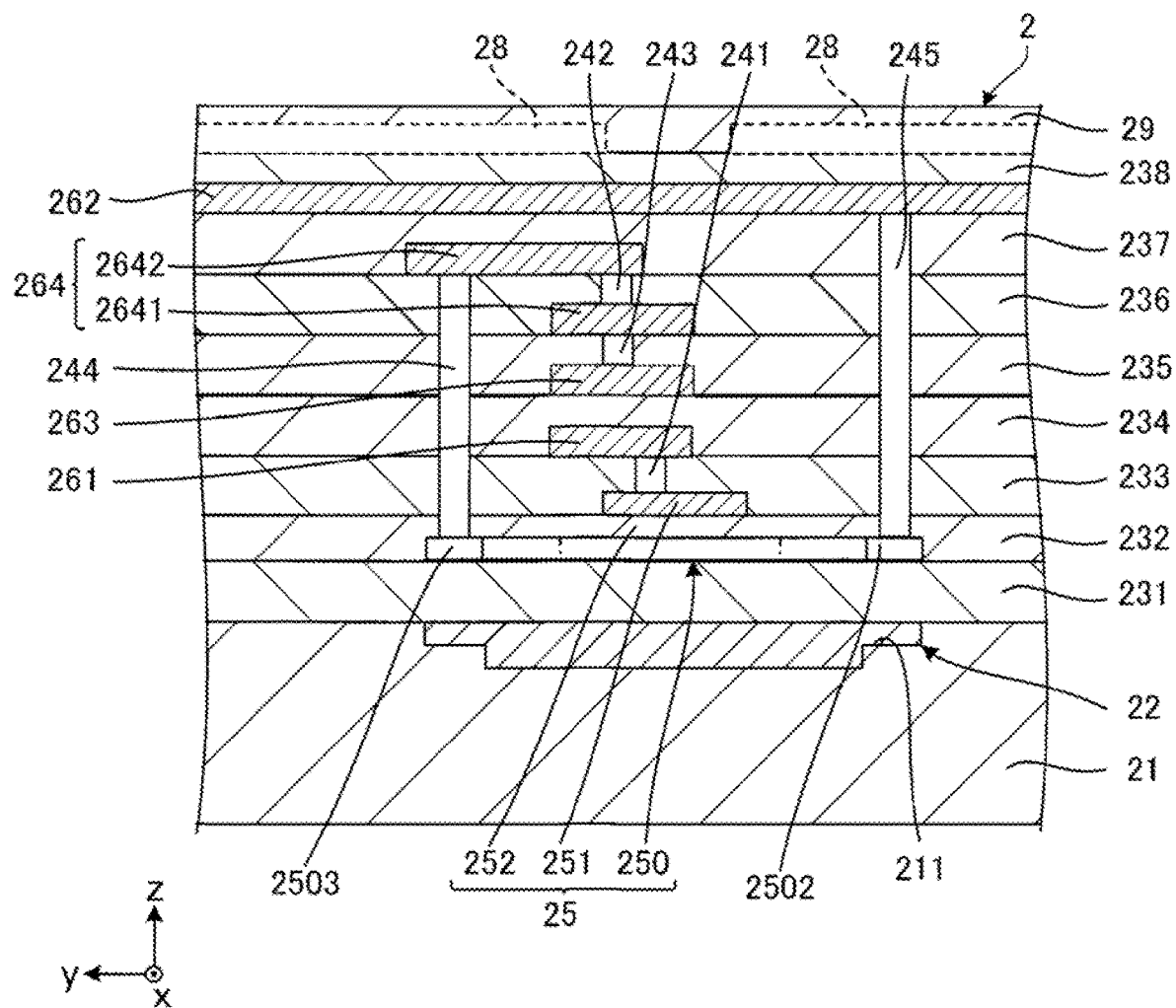
FIG. 5 is a partial cross-sectional view illustrating the element substrate according to the first exemplary embodiment.
Figure 6:
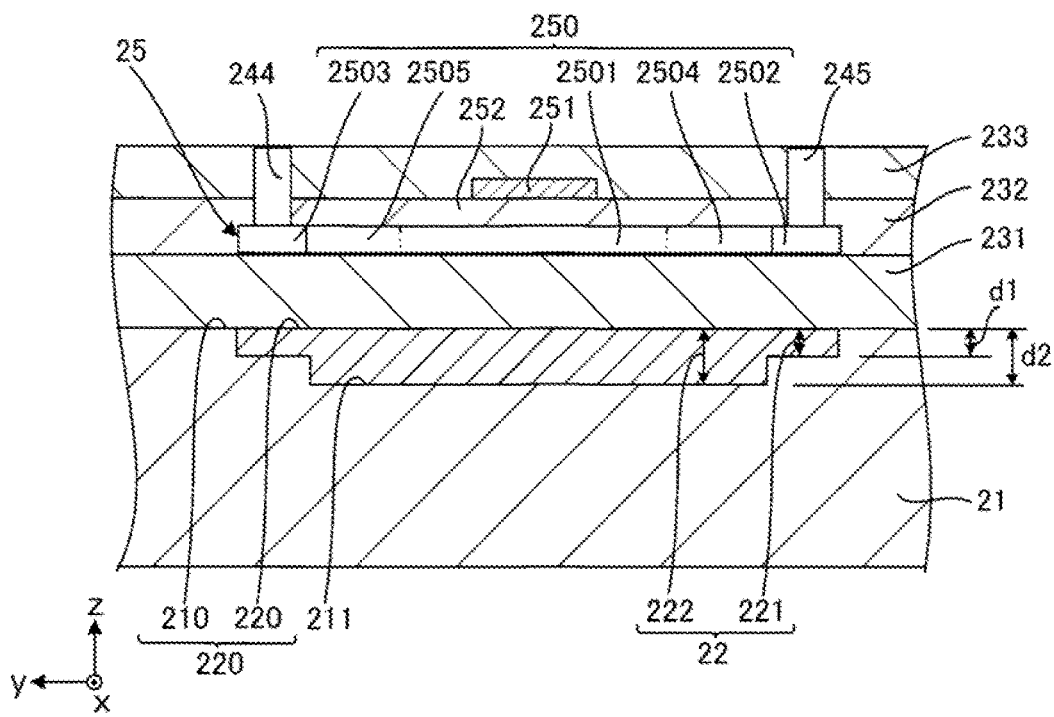
FIG. 6 is a cross-sectional view illustrating a light-shielding layer included in the element substrate according to the first exemplary embodiment.
Figure 7:
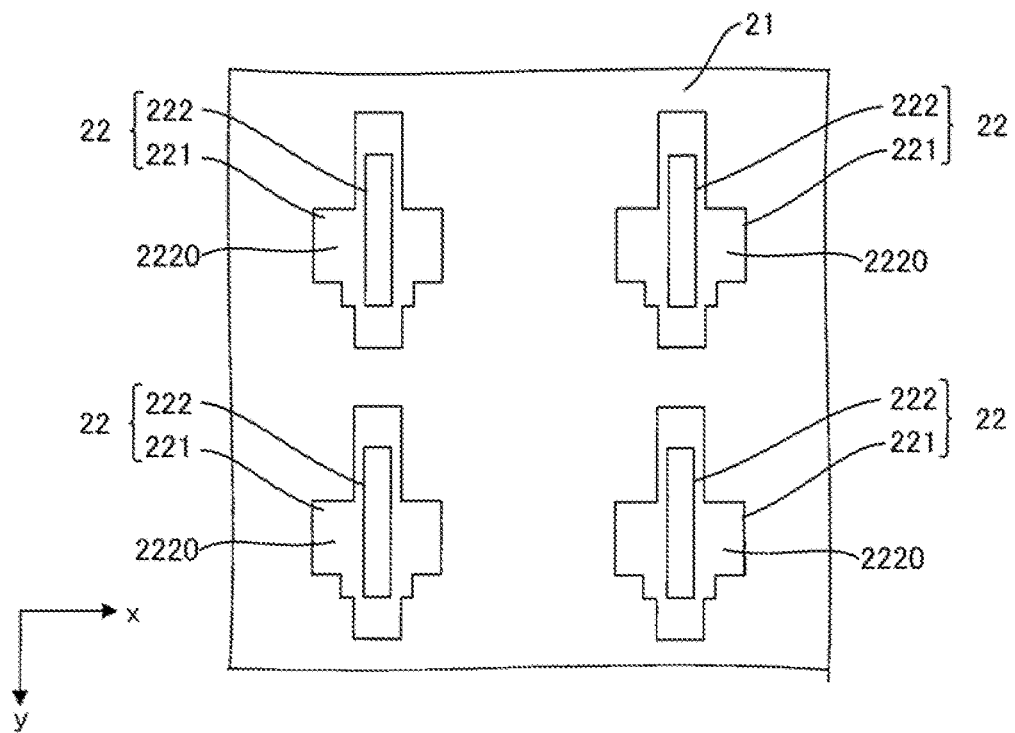
FIG. 7 is a plan view illustrating the light-shielding layer included in the element substrate according to the first exemplary embodiment.
Figure 8:
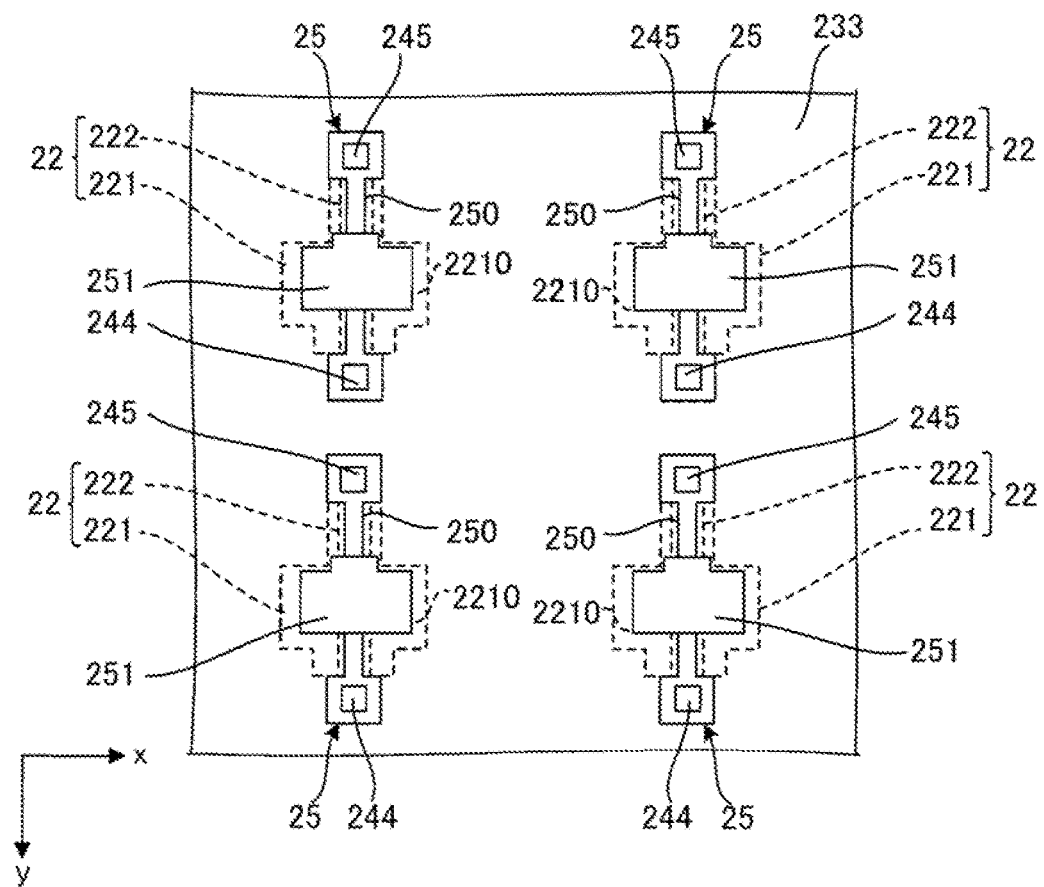
FIG. 8 is a plan view illustrating a TFT included in the element substrate according to the first exemplary embodiment.

Next, description will be made of a detailed configuration of a portion of the display region A10 of the element substrate 2 illustrated in FIG. 2. FIG. 4 is a partial plan view illustrating the element substrate according to the first exemplary embodiment. FIG. 5 is a partial cross-sectional view illustrating the element substrate according to the first exemplary embodiment, and is a cross-sectional view taken along the B-B line in FIG. 4. FIG. 6 is a cross-sectional view illustrating a light-shielding layer included in the element substrate according to the first exemplary embodiment. FIG. 7 is a plan view illustrating the light-shielding layer included in the element substrate according to the first exemplary embodiment. FIG. 8 is a plan view illustrating a TFT included in the element substrate according to the first exemplary embodiment.

The element substrate 2 illustrated in FIGS. 4 and 5 includes a substrate 21, a plurality of light-shielding bodies 22, a plurality of TFTs 25, a plurality of scan lines 261, a plurality of signal lines 262, a plurality of capacitance lines 263, a plurality of storage capacitor 264, a plurality of pixel electrodes 28, and an alignment film 29. Note that, in FIG. 4, illustration of the storage capacitors 264 and the alignment film 29 is not given. Below, each portion of the element substrate 2 will be sequentially described.

As illustrated in FIG. 5, the substrate 21 is a flat plate provided with a recessed portion 211 opened toward the TFT 25 side. The constituent material of the substrate 21 includes, for example, a silicon-based inorganic compound. More specifically, the substrate 21 is made, for example, of glass or quartz.

As illustrated in FIG. 6, the light-shielding layer 22 is embedded in the recessed portion 211 of the substrate 21. The light-shielding layer 22 has a light shielding property for visible light. Note that, in the present specification, the light shielding property means a light shielding property for visible light, and specifically means that the transmittance for visible light is equal to or less than 10%, and preferably, is equal to or less than 5%.

As illustrated in FIG. 7, the plurality of light-shielding bodies 22 are disposed in a matrix pattern in a plan view. The light-shielding layer 22 includes a first portion 221 and a second portion 222. The second portion 222 has a rectangular shape along the +y-axis direction in a plan view. The first portion 221 has a longitudinal shape along the +y-axis direction in a plan view, and surrounds the second portion 222. The first portion 221 includes a widened portion 2220 provided at the middle point in the +y-axis direction and having a width wider than the widths at both ends in a plan view. In addition, as illustrated in FIG. 6, the thickness d1 of the first portion 221 is thinner than the thickness d2 of the second portion 222. A surface 220 of the light-shielding layer 22 on the +z-axis side is located on the same plane as a surface 210 of the substrate 21 on the +z-axis side. The surface 210 and the surface 220 form a planar surface 200.

The constituent material of such a light-shielding layer 22 includes: metal such as tungsten (W), titanium (Ti), chromium (Cr), iron (Fe), aluminum (Al), and the like; metal alloy; metal silicide that is an alloy of metal and silicon; metallic compound such as metal nitride; and the like.

A first interlayer insulating layer 231 is disposed on the planar surface 200. The TFT 25 is disposed on the first interlayer insulating layer 231. One TFT 25 is disposed to form a pair with one light-shielding layer 22 described above. The TFT 25 includes a semiconductor layer 250, a gate electrode 251, and a gate insulating film 252. The semiconductor layer 250 is disposed on the first interlayer insulating layer 231. In addition, the gate insulating film 252 is interposed between the semiconductor layer 250 and the gate electrode 251.

As illustrated in FIG. 6, the semiconductor layer 250 includes a channel region 2501, a source region 2502, a drain region 2503, a first LDD region 2504, and a second LDD region 2505. The source region 2502 functions as a "source electrode". The drain region 2503 functions as a "drain electrode". The channel region 2501 is located between the source region 2502 and the drain region 2503. The channel region 2501 overlaps with the gate electrode 251 in a plan view. The first LDD region 2504 is located between the channel region 2501 and the source region 2502. The second LDD region 2505 is located between the channel region 2501 and the drain region 2503. Note that at least one of the first LDD region 2504 and the second LDD region 2505, in particular, the first LDD region 2504 may be omitted.

This semiconductor layer 250 is formed, for example, by forming polysilicon into a film. Impurities for enhancing electrical conductivity are doped in a region of the semiconductor layer 250 except for the channel region 2501. The concentrations of the impurities in the first LDD region 2504 and the second LDD region 2505 are lower than the concentrations of the impurities in the source region 2502 and the drain region 2503.

As illustrated in FIG. 8, the semiconductor layer 250 of the TFT 25 has a longitudinal shape along the +y-axis direction in a plan view, and the longitudinal direction of the semiconductor layer 250 is in parallel to the longitudinal direction of the light-shielding layer 22. In addition, the TFT 25 overlaps with the light-shielding layer 22 in a plan view. As the TFT 25 and the light-shielding layer 22 overlap with each other in a plan view, the light-shielding layer 22 blocks light, and hence, entrance of light into the TFT 25 can be prevented or be reduced.

More specifically, the channel region 2501, the first LDD region 2504, and the second LDD region 2505 overlap with the second portion 222 in a plan view as illustrated in FIG. 6. Here, when light enters the channel region 2501, the first LDD region 2504, and the second LDD region 2505, malfunction of the TFT 25 is more likely to occur due to leakage current. Thus, it can be said that the channel region 2501, the first LDD region 2504, and the second LDD region 2505 are portions that particularly need the light shielding property. For this reason, by configuring the second portion 222 having a thickness thicker than and having a light shielding property greater than the first portion 221 to overlap with the channel region 2501, the first LDD region 2504, and the second LDD region 2505 in a plan view as described above, it is possible to particularly effectively prevent malfunction of the TFT 25 due to leakage current. Note that the malfunction of the TFT 25 resulting from leakage current due to light is more likely to occur in the order of: the second LDD region 2505, the channel region 2501, and the first LDD region 2504.

Note that the gate electrode 251 and the light-shielding layer 22 described above may be electrically coupled to each other. In this case, the light-shielding layer 22 can be used as a back gate. In addition, in this case, although illustration is not given, a contact that electrically couples the gate electrode 251 and the light-shielding layer 22 can be formed between the gate electrode 251 and the widened portion 2220 to overlap with the gate electrode 251 and the widened portion 2220 in a plan view.

As illustrated in FIG. 5, a second interlayer insulating layer 232 is disposed on the semiconductor layer 250, and a third interlayer insulating layer 233 is disposed on the second interlayer insulating layer 232 to cover the gate electrode 251. Furthermore, the scan line 261 is disposed on the third interlayer insulating layer 233. In addition, a contact hole is provided in the third interlayer insulating layer 233, and a contacting portion 241 for electrically coupling the scan line 261 and the gate electrode 251 is disposed in the contact hole.

A fourth interlayer insulating layer 234 is disposed on the third interlayer insulating layer 233 to cover the scan line 261. The capacitance line 263 is disposed on the fourth interlayer insulating layer 234. A fifth interlayer insulating layer 235 is disposed on the fourth interlayer insulating layer 234 to cover the capacitance line 263.

The storage capacitor 264 includes a first capacitor 2641 and a second capacitor 2642. The first capacitor 2641 is disposed on the fifth interlayer insulating layer 235. A sixth interlayer insulating layer 236 is disposed on the fifth interlayer insulating layer 235 to cover the first capacitor 2641. A second capacitor 2642 is disposed on the sixth interlayer insulating layer 236. A contact hole is provided in the sixth interlayer insulating layer 236, and a contacting portion 242 for electrically coupling the first capacitor 2641 and the second capacitor 2642 is disposed in this contact hole. Although detailed illustration is not given, the first capacitor 2641 and the second capacitor 2642 each include two capacitance electrodes, and a dielectric disposed between these capacitance electrodes.

Furthermore, a contact hole is provided in the fifth interlayer insulating layer 235, and a contacting portion 243 for electrically coupling the first capacitor 2641 and the capacitance line 263 is disposed in this contact hole. A contact hole is provided in the second to six interlayer insulating layers 232 to 236, and a contacting portion 244 for electrically coupling the second capacitor 2642 and the drain region 2503 is disposed in this contact hole. In addition, the drain region 2503 is electrically coupled to the pixel electrode 28 via the contacting portion 244, the storage capacitor 264, a not-illustrated contact, and the like.

A seventh interlayer insulating layer 237 is disposed on the sixth interlayer insulating layer 236 to cover the second capacitor 2642. The signal line 262 is disposed on the seventh interlayer insulating layer 237. In addition, an intersecting portion where the signal line 262 and the scan line 261 intersect each other in a plan view overlaps with the TFT 25 as illustrated in FIG. 4. Furthermore, as illustrated in FIG. 5, a contact hole is provided in the second to seventh interlayer insulating layers 232 to 237, and a contacting portion 245 for electrically coupling the signal line 262 and the source region 2502 is disposed in this contact hole.

An eighth interlayer insulating layer 238 is disposed on the seventh interlayer insulating layer 237 to cover the signal line 262. The pixel electrode 28 is disposed on the eighth interlayer insulating layer 238. One pixel electrode 28 and one TFT 25 described above form a pair. In addition, the alignment film 29 is disposed on the pixel electrode 28.

The first to eighth interlayer insulating layers 231 to 238 described above are formed using, for example, silicon-based inorganic compound, and more specifically, is made, for example, of silicon thermal oxide layer or silicon oxide film formed through a vapor deposition method such as a chemical vapor deposition (CVD) method. Furthermore, the constituent material of the capacitance electrode included in each of the scan line 261, the signal line 262, the capacitance line 263, and the storage capacitor 264 includes, for example, material having electrical conductivity such as polysilicon, metal, metal silicide, and metal compound. In addition, the constituent material of each of the contacting portions 241 to 245 described above is formed using material having electrical conductivity.

These are descriptions of the configuration of the element substrate 2 in the display region A10. As described above, the element substrate 2 includes the pixel electrode 28 having a having light-transmissive property, the substrate 21 having a light-transmissive property, the TFT 25 serving as a switching element electrically coupled to the pixel electrode 28, and the light-shielding layer 22 being in contact with the substrate 21 and overlapping with the TFT 25 in a plan view from a thickness direction of the substrate 21. The light-shielding layer 22 includes the first portion 221 and the second portion 222 having a thickness d2 thicker than the thickness d1 of the first portion 221, as illustrated in FIG. 6.

In the element substrate 2 described above, the light-shielding layer 22 includes the first portion 221 and the second portion 222 having thicknesses different from each other, and hence, it is possible to reduce troubles such as warpage of the substrate 2 and crack of the light-shielding layer 22 while achieving the light shielding property. In a case where the entire thickness of the light-shielding layer 22 is set to the thickness d2 in order to enhance the light shielding property, the element substrate 2 might largely warp due to stress occurring in the element substrate 2. On the contrary, in a case where the entire thickness of the light-shielding layer 22 is set to the thickness d1, the light shielding property is not sufficient. Thus, in the case of the element substrate 2, the second portion 222 is disposed to overlap with a portion that particularly needs the light shielding property among the TFT 25 in a plan view, and the first portion 221 is disposed to overlap with a portion requiring the light shielding property but less affected by light than the above-described portion where the light shielding property is particularly needed. By using the light-shielding layer 22 described above, it is possible to enhance the light shielding property in connection with the TFT 25 while reducing occurrence of troubles. As a result, it is possible to improve quality of the electro-optical device 1.

Furthermore, as described above, the TFT 25 includes the gate electrode 251, the source region 2502 serving as a "source electrode", and the drain region 2503 serving as a "drain electrode". In addition, the second portion 222 is disposed between the source region 2502 and the drain region 2503 in a plan view. The channel region 2501, the first LDD region 2504, and the second LDD region 2505 are located between the source region 2502 and the drain region 2503 in a plan view. The channel region 2501, the first LDD region 2504, and the second LDD region 2505 are portions that particularly need the light shielding property as described above. Thus, by configuring these portions to overlap with the second portion 222 in a plan view, it is possible to particularly effectively prevent malfunction of the TFT 25 due to leakage current.

Note that, the present exemplary embodiment employs an example in which the source region 2502 functions as a "source electrode". However, the "source electrode" may be regarded as a portion of the contacting portion 245 which is in contact with the source region 2502 and overlaps with the source region 2502. Similarly, the present exemplary embodiment employs an example in which the drain region 2503 functions as a "drain electrode". However, a portion of the contacting portion 244 which is in contact with the drain region 2503 and overlaps with the drain region 2503 may be regarded as the "drain electrode".

Furthermore, it is only necessary that the thickness d2 is greater than the thickness d1 as described above. More specifically, the thickness d1 may be set to be not less than 0.1 nm and not greater than 300 nm, and the thickness d2 may be set to be the thickness d1+10 to 300 nm.

Furthermore, the substrate 21 is provided with a recessed portion 211 in which the light-shielding layer 22 is disposed, the recessed portion being opened toward the TFT 25 side as described above. With the light-shielding layer 22 being disposed within the recessed portion 211, it is possible to reduce peeling off of the light-shielding 22 from the substrate 21, for example, at the time of manufacturing, as compared when the light-shielding 22 is disposed to protrude from the surface 220 of the substrate 21 toward the TFT 25 side. For this reason, it is possible to enhance yield of the substrate 21.

Note that the substrate 21 may not include the recessed portion 211. In addition, the light-shielding layer 22 may be disposed to protrude from the surface 220.

Furthermore, as described above, the planar surface 200 is configured by the surface 210 of the substrate 21 on the TFT 25 side and the surface 220 of the light-shielding layer 22 on the TFT 25 side. With the planar surface 200 being configured, there is no step between the surface 210 and the surface 220, and hence, light does not irregularly reflect at the step. This also makes it possible to reduce a possibility that light enters the TFT 25.

Note that a step may exist between the surface 210 and the surface 220.

1-1d. Configuration of Element Substrate in Peripheral Region

Figure 9:
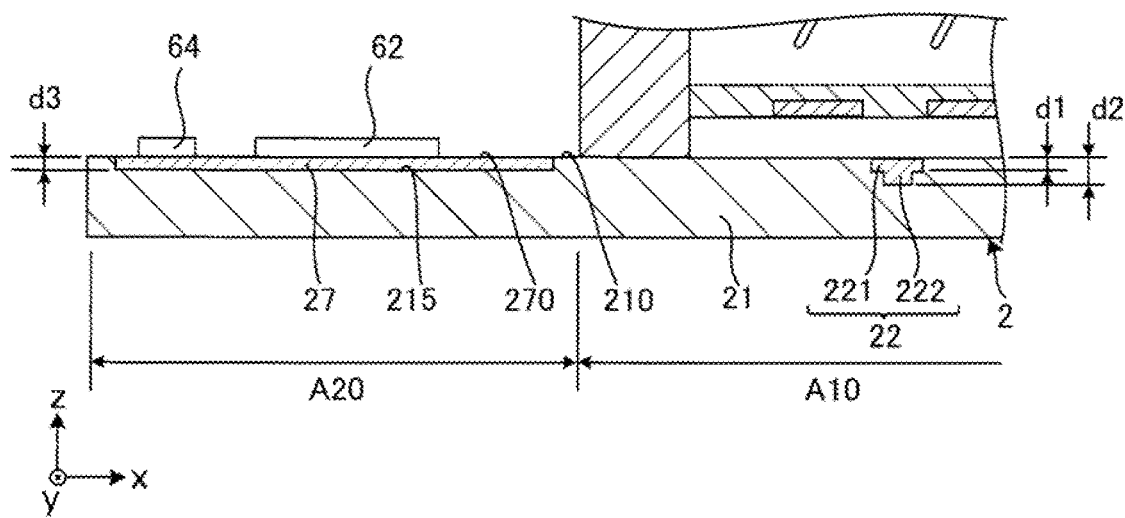
FIG. 9 is a cross-sectional view illustrating a circuit light-shielding layer included in the element substrate in the first exemplary embodiment.

Next, a detailed configuration of a portion of the peripheral region A20 of the element substrate 2 illustrated in FIG. 2 will be described. FIG. 9 is a cross-sectional view illustrating a circuit light-shielding layer included in the element substrate according to the first exemplary embodiment.

As illustrated in FIG. 9, the element substrate 2 includes a circuit light-shielding layer 27 disposed in the peripheral region A20. The circuit light-shielding layer 27 is embedded in a recessed portion 215 opened toward the +z-axis direction of the element substrate 2. A surface 270 of the circuit light-shielding layer 27 on the +z-axis side is located on the same plane as the surface 220 of the substrate 21 on the +z-axis side.

The circuit light-shielding layer 27 is disposed across almost the entire area of the peripheral region A20 illustrated in FIGS. 1 and 2, and overlaps with the scan-line driving circuit 61, the signal-line driving circuit 62, the external terminal 64, and the wiring line 65 in a plan view. In addition, as illustrated in FIG. 9, the thickness d3 of the circuit light-shielding layer 27 is thinner than the thickness d2 of the second portion 222 of the light-shielding layer 22 described above. Note that, in the case of the present exemplary embodiment, the thickness d3 of the circuit light-shielding layer 27 is equal to the thickness d1 of the first portion 221.

As the thickness d3 is thinner than the thickness d2, it is possible to reduce stress occurring in the substrate 21 due to the circuit light-shielding layer 27, as compared when the thickness d3 is thicker than the thickness d2.

Note that the thickness d3 may be thicker than the thickness d1 or may be thinner than the thickness d1. Furthermore, the thickness d3 may be thicker than the thickness d2. In addition, the circuit light-shielding layer 27 may have a constant thickness, or may have portions with different thicknesses. Moreover, the element substrate 2 may not include the circuit light-shielding layer 27.

1-1e. Method for Manufacturing Element Substrate

Figure 10:
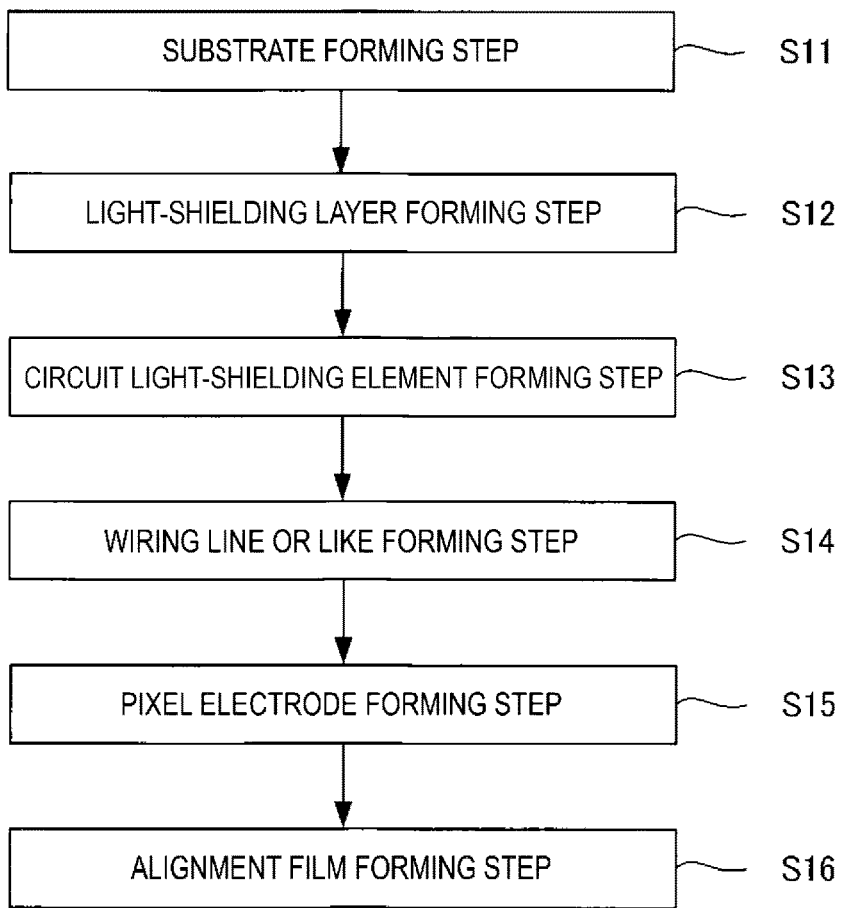
FIG. 10 is a flowchart illustrating a method for manufacturing the element substrate according to the first exemplary embodiment.

Next, a method for manufacturing the element substrate 2 will be described. FIG. 10 is a flowchart illustrating a method for manufacturing the element substrate according to the first exemplary embodiment.

The method for manufacturing the element substrate 2 includes a substrate forming step S11, a light-shielding layer forming step S12, a circuit light-shielding layer forming step S13, a wiring line or the like forming step S14, a pixel-electrode forming step S15, and an alignment-film forming step S16. These steps are performed sequentially to manufacture the element substrate 2. Note that the light-shielding layer forming step S12 and the circuit light-shielding layer forming step S13 may be performed concurrently or in parallel, and the light-shielding layer forming step S12 may be performed after the circuit light-shielding layer forming step S13.

Figure 11:
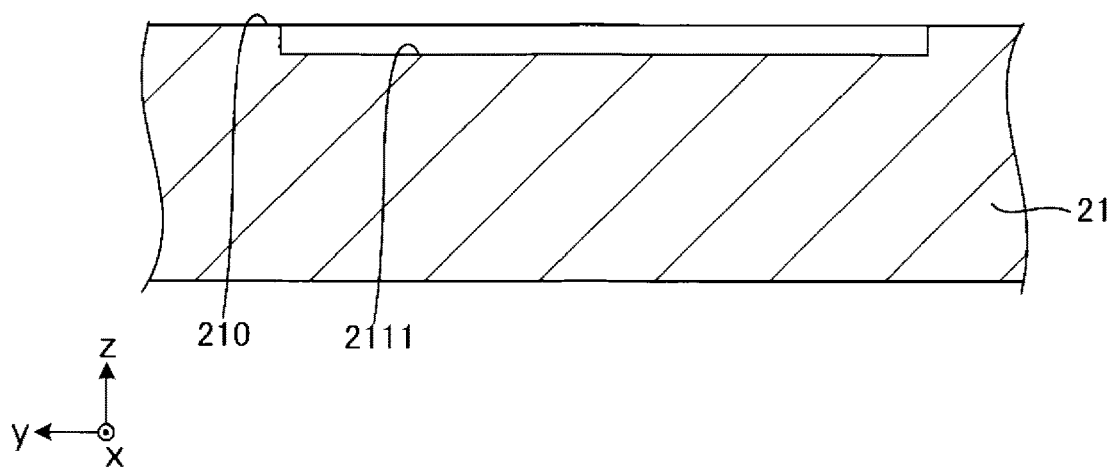
FIG. 11 is a cross-sectional view for explaining a substrate forming step according to the first exemplary embodiment.
Figure 12:
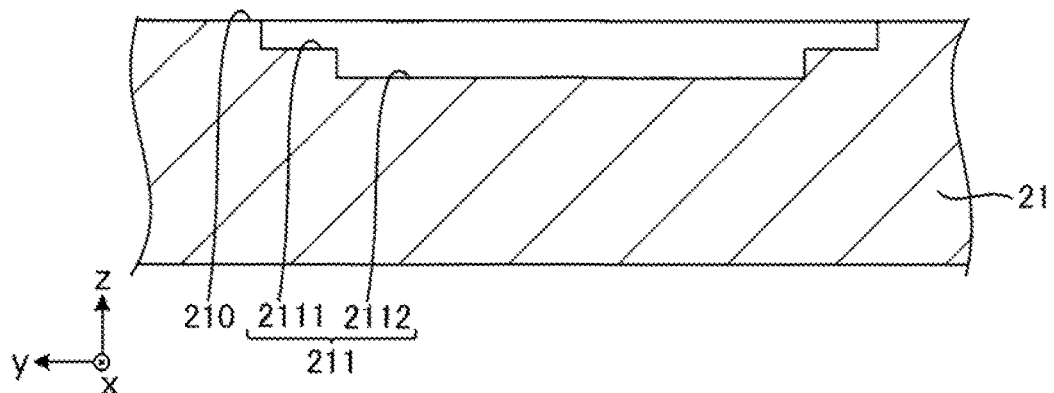
FIG. 12 is a cross-sectional view for explaining the substrate forming step according to the first exemplary embodiment.

FIGS. 11 and 12 are cross-sectional views for explaining the substrate forming step according to the first exemplary embodiment. First, in the substrate forming step S11, for example, etching is performed to a flat plate configured by a glass plate, a quartz plate, or the like to form a first recessed portion 2111 as illustrated in FIG. 11. After this, etching is further performed to the bottom portion of the first recessed portion 2111 to form a second recessed portion 2112 as illustrated in FIG. 12. Through such formation, the recessed portion 211 is formed in the substrate 21. In addition, in this step, the recessed portion 215 illustrated in FIG. 9 is also formed, although detained illustration is not given.

Figure 13:
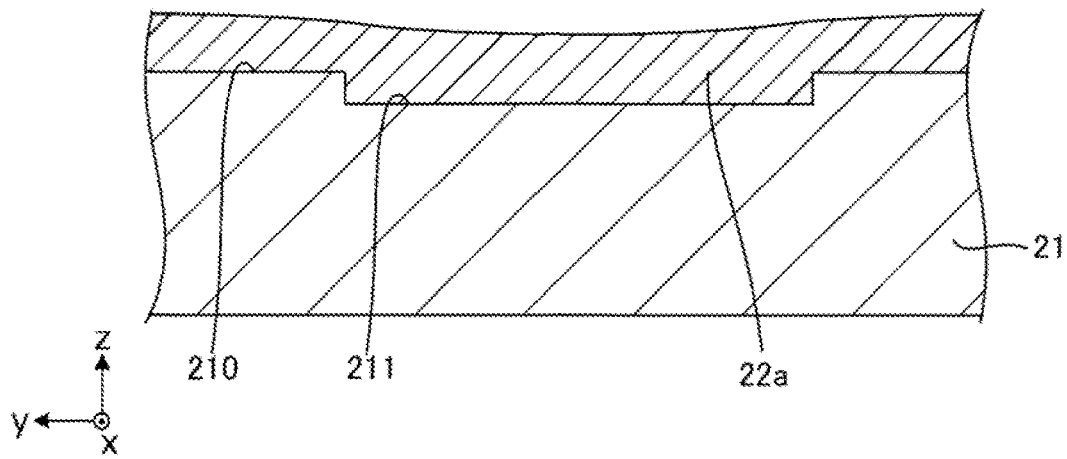
FIG. 13 is a cross-sectional view for explaining the light-shielding layer forming step according to the first exemplary embodiment.
Figure 14:
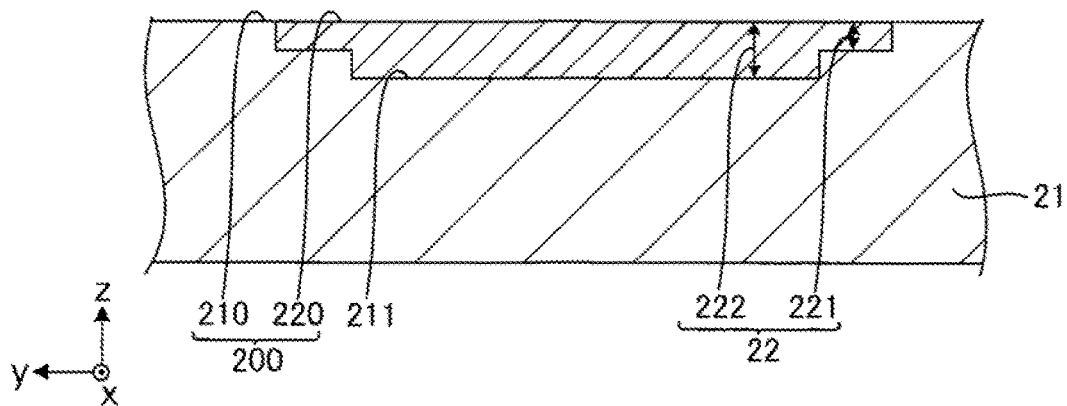
FIG. 14 is a cross-sectional view for explaining the light-shielding layer forming step according to the first exemplary embodiment.

FIGS. 13 and 14 are cross-sectional views for explaining the light-shielding layer forming step according to the first exemplary embodiment. Next, in the light-shielding layer forming step S12, a composition for a light-shielding layer including metal or the like is deposited within the recessed portion 211, for example, through a vapor deposition method such as CVD to form a light-shielding layer 22a as illustrated in FIG. 13. After this, a planarization process using polishing such as chemical mechanical polishing (CMP) is applied to the light-shielding layer 22a to form the light-shielding layer 22 illustrated in FIG. 14. By applying polishing such as CMP, it is possible to easily form the planar surface 200 configured by the surface 220 of the light-shielding layer 22 and the surface 210 of the substrate 21.

In addition, although detailed illustration is not given, in the circuit light-shielding layer forming step S13, the circuit light-shielding layer 27 is formed using a method similar to the method used in the light-shielding layer forming step S12.

Furthermore, in the wiring line or the like forming step S14, the TFT 25, the scan line 261, the signal line 262, the capacitance line 263, the storage capacitor 264, and the first to eighth interlayer insulating layers 231 to 238 are formed, although detailed illustration is not given. The capacitance electrodes of the TFT 25, the scan line 261, the signal line 262, the capacitance line 263, and the storage capacitor 264 are formed, for example, by forming a metal film using a sputtering method or vapor deposition method, and applying etching to the metal film using a resist mask. The first to eighth interlayer insulating layers 231 to 238 are formed in a manner such that an insulating film is formed through a vapor deposition method or the like, and a planarization process is applied to the insulating film, for example, using polishing such as CMP.

Furthermore, although detailed illustration is not given, in the pixel-electrode forming step S15, the pixel electrode 28 is formed on the eighth interlayer insulating layer 238. The pixel electrode 28 is formed, for example, in such a manner that a layer made of a transparent conductive material is formed using a vapor deposition method such as a CVD method and then the layer is patterned using a mask.

Furthermore, although detailed illustration is not given, in the alignment-film forming step S16, the alignment film 29 is formed, for example, in a manner that a layer made of polyimide is formed using a vapor deposition method such as a CVD method and then a rubbing treatment is performed to the layer.

In the manner as described above, the element substrate 2 illustrated in FIG. 4 can be formed. In addition, the counter substrate 3 is formed, for example, using a known technology as appropriate, and the counter substrate 3 is coupled to the element substrate 2 via the sealing member 4. Subsequently, a liquid crystal material is injected between the element substrate 2, the counter substrate 3, and the sealing member 4 to form the liquid crystal layer 5. And after this, sealing is performed. Further, a various type of circuits and the like are appropriately formed as well. In such a manner, the electro-optical device 1 illustrated in FIGS. 1 and 2 can be manufactured.

As described above, through manufacturing the element substrate 2, the recessed portion 211 configured by the first recessed portion 2111 and the second recessed portion 2112 is formed in the substrate 21, a composition for the light-shielding layer is deposited on the recessed portion 211 to form the light-shielding layer 22a, and then, the light-shielding layer 22 is formed using a method in which a planarization process such as CMP is applied. In other words, the light-shielding layer 22 is formed using a so-called dual damascene method. Using the dual damascene method, it is possible to easily form the planar surface 200 and enhance a smoothness of the planar surface 200. In addition, using the dual damascene method, it is possible to reduce occurrence of, for example, crack in the light-shielding layer 22, as compared with, for example, a method in which a light-shielding layer is formed by forming a light shielding film on the substrate 21 without forming the recessed portion 211 in the substrate 21, and applying etching on the formed light shielding film. In other words, by using the dual damascene method, it is possible to enhance the resistance of the light-shielding layer 22 to cracking.

Furthermore, in the case of the element substrate 2 including plural pixel electrodes 28 and TFTs 25, to form an element substrate 2 having a reduced size and exhibiting high quality, it is desired for the light-shielding layer 22 to have a very small size and exhibit excellent accuracy in shape. With the dual damascene method described above, it is possible to form the light-shielding layer 22 having a very small size and exhibiting excellent accuracy in shape.

1-2. Second Exemplary Embodiment

Figure 15:
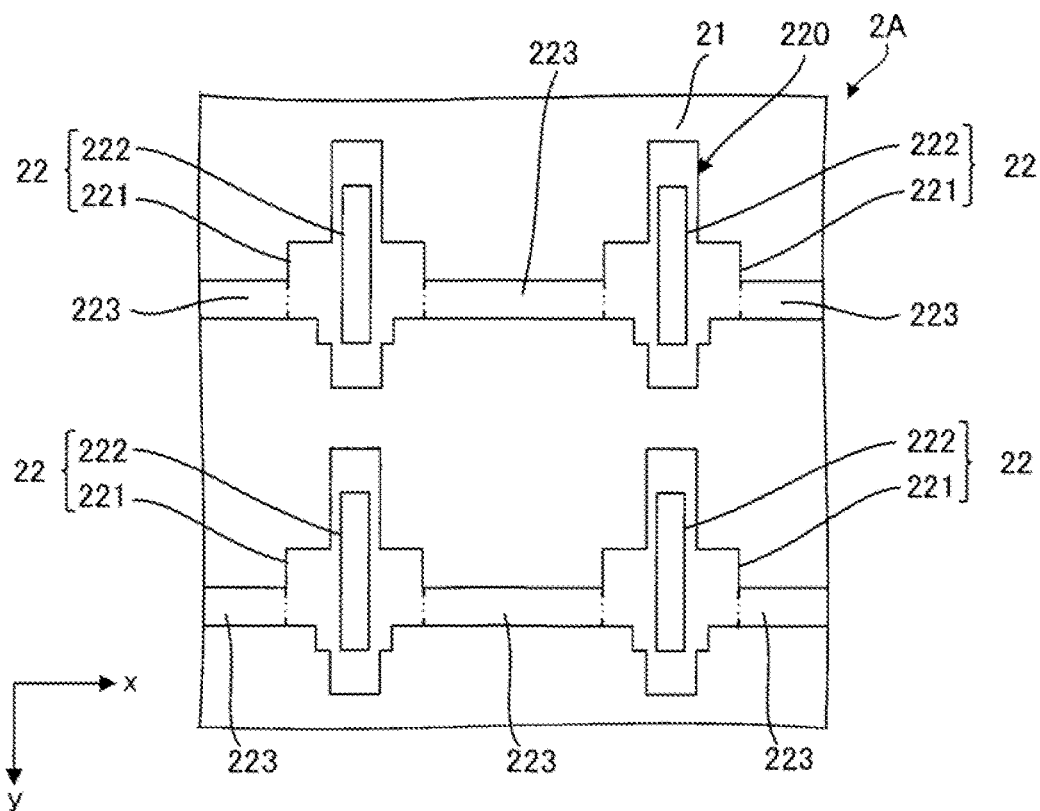
FIG. 15 is a plan view illustrating a light-shielding layer included in an element substrate according to a second exemplary embodiment.

Next, a second exemplary embodiment of the present disclosure will be described below. FIG. 15 is a plan view illustrating a light-shielding layer included in an element substrate according to the second exemplary embodiment.

The present exemplary embodiment is similar to the first exemplary embodiment except, mainly, that the configurations of the light-shielding bodies are different from each other. Note that, in the descriptions below, the second exemplary embodiment will be described with focus being placed on things differing from those in the first exemplary embodiment, and descriptions of similar matters will not be repeated. In addition, in FIG. 15, the same reference numbers are given to configurations similar to those in the first exemplary embodiment.

An element substrate 2A illustrated in FIG. 15 includes a coupling portion 223 that couples adjacent light-shielding bodies 22 together. In the present exemplary embodiment, a plurality of light-shielding bodies 22 arranged alongside along the +x-axis direction are each coupled to an adjacent light-shielding layer 22 through the coupling portion 223. More specifically, a light-shielding layer 22 located on the upper left in FIG. 15 is coupled to a light-shielding layer 22 located on the upper right in FIG. 15 through the coupling portion 223. In addition, a light-shielding layer 22 located on the lower left in FIG. 15 is coupled to a light-shielding layer 22 located on the lower right in FIG. 15 through the coupling portion 223.

With the adjacent light-shielding bodies 22 being coupled to each other through the coupling portion 223 as illustrated in the drawing, it is possible to use the plurality of light-shielding bodies 22 and the plurality of coupling portions 223 as scan lines by electrically coupling the light-shielding layer 22 and the gate electrode 251 of the TFT 25 together.

In the case of the present exemplary embodiment, it is also possible to enhance the light shielding property in connection with the TFT 25 while reducing occurrence of troubles in the element substrate 2A, as with the first exemplary embodiment.

1-3. Third Exemplary Embodiment

Figure 16:
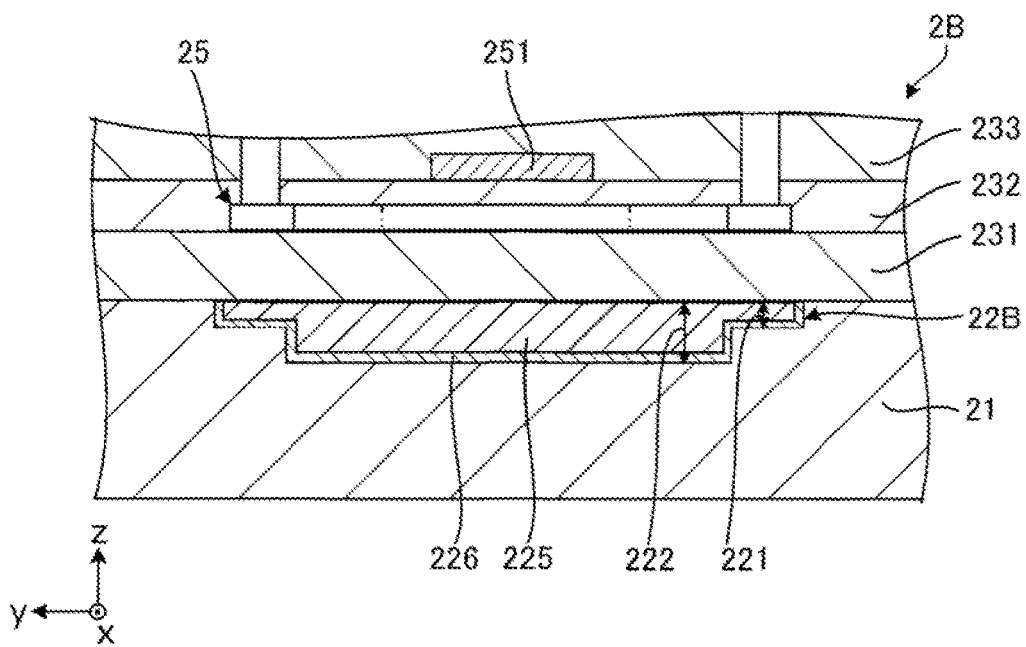
FIG. 16 is a cross-sectional view illustrating a light-shielding layer included in an element substrate according to a third exemplary embodiment.

Next, a third exemplary embodiment of the present disclosure will be described below. FIG. 16 is a cross-sectional view illustrating a light-shielding layer included in an element substrate in the third exemplary embodiment.

The present exemplary embodiment is similar to the first exemplary embodiment except, mainly, that the configurations of the light-shielding bodies are different from each other. Note that, in the descriptions below, the third exemplary embodiment will be described with focus being placed on things differing from those in the first exemplary embodiment, and descriptions of similar matters will not be repeated. In addition, in FIG. 16, the same reference numbers are given to configurations similar to those in the first exemplary embodiment.

A light-shielding layer 22B included in an element substrate 2B illustrated in FIG. 16 includes the metal film 225 containing tungsten, and also includes a metal nitride film 226 disposed between the metal film 225 and the substrate 21 and containing tungsten nitride (WN) or titanium nitride (TiN).

With the light-shielding layer 22B including the metal nitride film 226, it is possible to enhance an adhesive property between the light-shielding layer 22B and the substrate 21, as compared when the metal nitride film 226 is not provided. In addition, with the metal film 225 containing tungsten being provided, it is possible to enhance the light shielding property of the light-shielding layer 22B.

Here, a film made of tungsten nitride or titanium nitride is more likely to be crystallized due to thermal treatment at the time of manufacturing of each film, and the optical density (OD) value is more likely to reduce. On the other hand, a film made of tungsten exhibits excellent heat resistance, and the OD value is less likely to reduce even with a thermal treatment being applied at the time of manufacturing. Thus, with the metal film 225 containing tungsten being provided, it is possible to prevent the OD value from reducing, for example, due to a thermal treatment or the like at the time of manufacturing, and hence, it is possible to enhance the light shielding property of the light-shielding layer 22B.

Even with the present exemplary embodiment, it is also possible to enhance the light shielding property in connection with the TFT 25 while reducing occurrence of troubles in the element substrate 2B, as with the first exemplary embodiment.

1-4. Fourth Exemplary Embodiment

Figure 17:
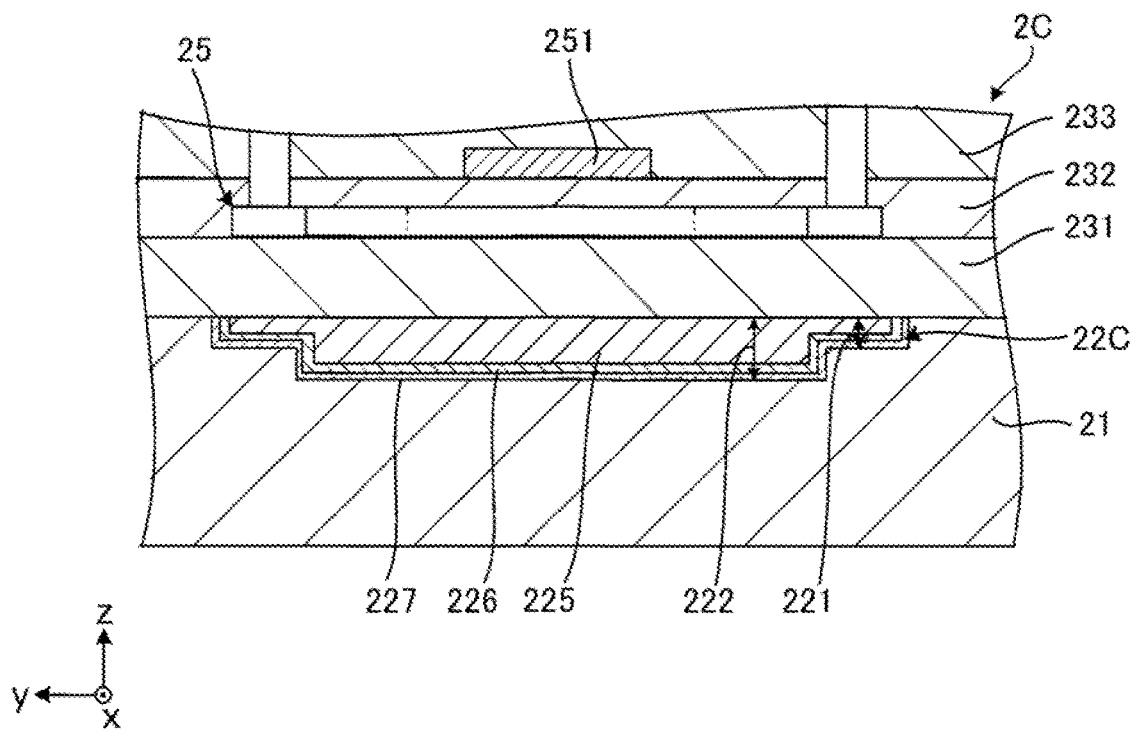
FIG. 17 is a cross-sectional view illustrating a light-shielding layer included in an element substrate according to a fourth exemplary embodiment.

Next, a fourth exemplary embodiment of the present disclosure will be described below. FIG. 17 is a cross-sectional view illustrating a light-shielding layer included in an element substrate according to the fourth exemplary embodiment.

The present exemplary embodiment is similar to the third exemplary embodiment except, mainly, that the light-shielding layer includes a tungsten silicide film. Note that, in the descriptions below, the fourth exemplary embodiment will be described with focus being placed on things differing from those in the third exemplary embodiment, and descriptions of similar matters will not be repeated. In FIG. 17, the same reference numbers are given to configurations similar to those in the third exemplary embodiment.

A light-shielding layer 22C included in an element substrate 2C illustrated in FIG. 17 includes a tungsten silicide film 227 disposed between a metal nitride film 226 and the substrate 21 and containing tungsten silicide (WSi).

With the light-shielding layer 22C including the tungsten silicide film 227, it is possible to enhance an adhesive property between the light-shielding layer 22C and the substrate 21, as compared when the tungsten silicide film 227 is not provided. In particular, the substrate 21, of which constituent material is a silicon-based inorganic compound, has a high adhesive property with the tungsten silicide film 227 containing silicon atom. In addition, the metal nitride film 226 functions as a barrier layer that prevents tungsten silicide contained in the tungsten silicide film 227 from dispersing into the metal film 225. This enables the OD value of the metal film 225 to be prevented from reducing. Thus, with the tungsten silicide film 227 being provided, it is possible to further enhance the adhesive property with the substrate 21 and also increase the OD value, as compared when the tungsten silicide film 227 is not provided.

Note that the metal film 225 may contain, for example, approximately 5% of other metal other than the metals described above. Furthermore, the metal nitride film 226 and the tungsten silicide film 227 may each contain, for example, approximately 5% of other material other than the materials described above.

Even with the present exemplary embodiment, it is also possible to enhance the light shielding property in connection with the TFT 25 while reducing occurrence of troubles in the element substrate 2C, as with the third exemplary embodiment.

1-5. Fifth Exemplary Embodiment

Figure 18:
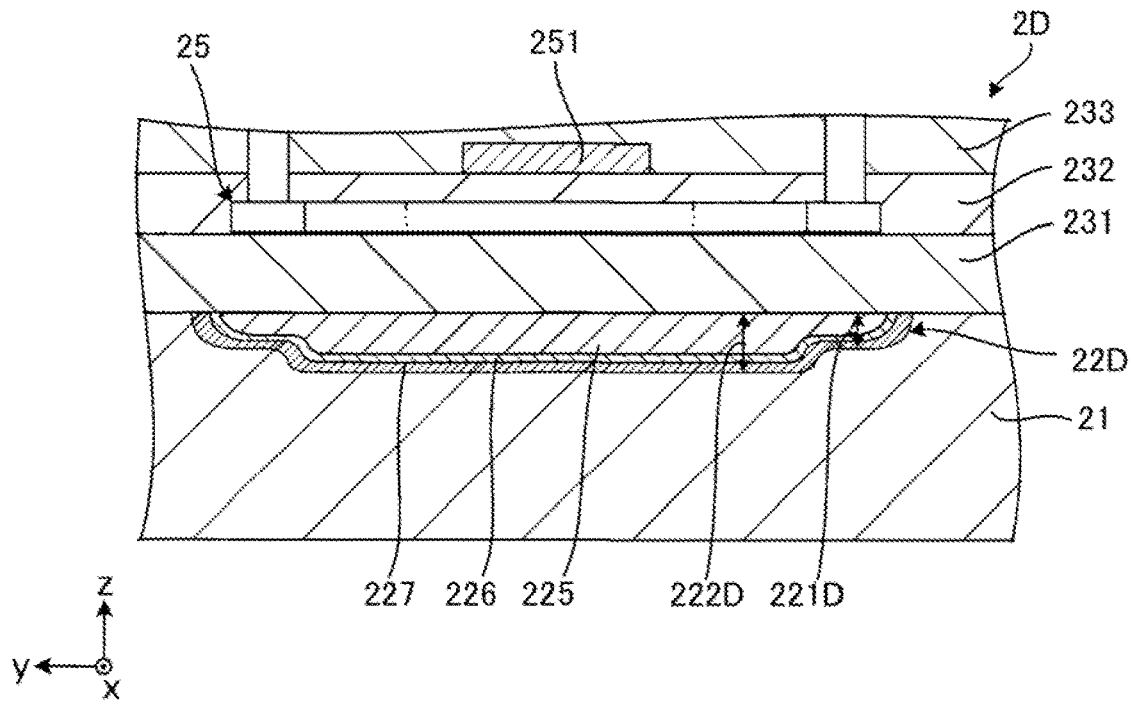
FIG. 18 is a cross-sectional view illustrating a light-shielding layer included in an element substrate according to a fifth exemplary embodiment.
Figure 19:
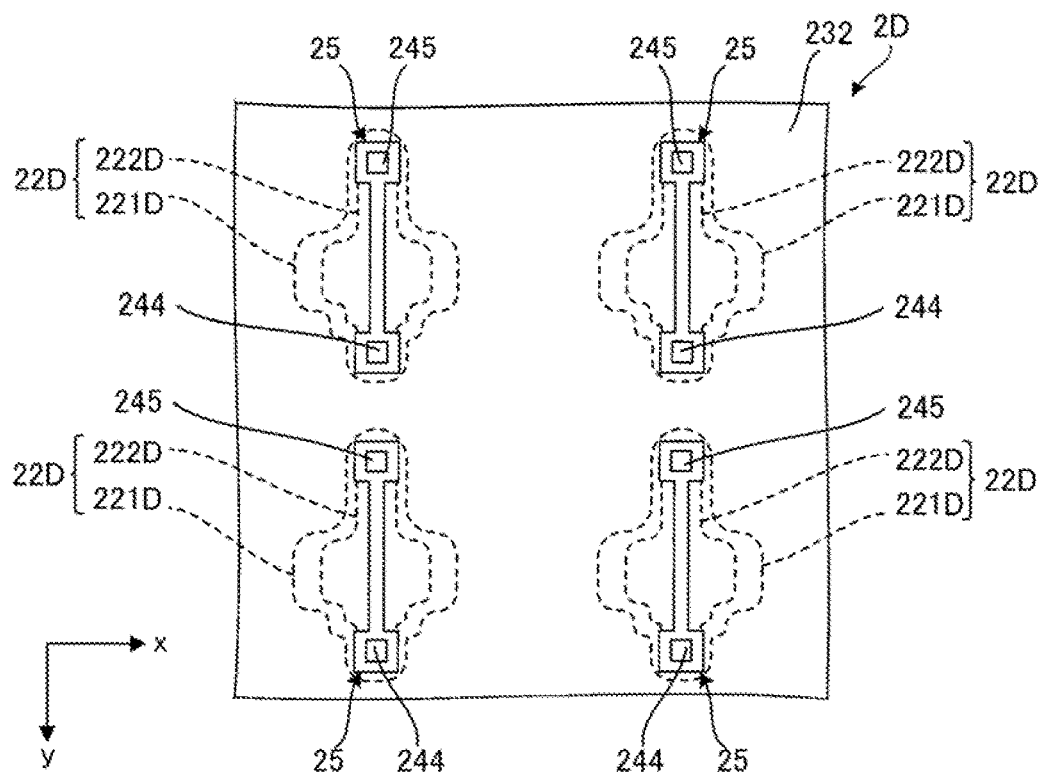
FIG. 19 is a plan view illustrating a light-shielding layer included in the element substrate according to the fifth exemplary embodiment.

Next, a fifth exemplary embodiment of the present disclosure will be described. FIG. 18 is a cross-sectional view illustrating a light-shielding layer included in an element substrate according to the fifth exemplary embodiment. FIG. 19 is a plan view illustrating a light-shielding layer included in the element substrate according to the fifth exemplary embodiment.

The present exemplary embodiment is similar to the fourth exemplary embodiment except, mainly, that the shapes of the light-shielding bodies are different from each other. Note that, in the descriptions below, the fifth exemplary embodiment will be described with focus being placed on things differing from those in the fourth exemplary embodiment, and descriptions of similar matters will not be repeated. In addition, in FIGS. 18 and 19, the same reference numbers are given to configurations similar to those in the fourth exemplary embodiment.

While the outer shape of the light-shielding layer 22C in the fourth exemplary embodiment has corners having an internal angle of 90°, the outer shape of a light-shielding layer 22D included in an element substrate 2D illustrated in FIGS. 18 and 19 has rounded corners. In addition, the plan-view shape, of a second portion 222D included in the light-shielding layer 22D is similar to the plan-view shape, of a first portion 221D, as illustrated in FIG. 19. In addition, the thickness of the first portion 221D is thinner than the thickness of the second portion 222D. With the light-shielding layer 22D having such a shape, it is also possible to improve the light-shielding property while reducing warpage or the like of the element substrate 2D, as with the light-shielding layer 22C in the fourth exemplary embodiment.

Even with the present exemplary embodiment, it is also possible to enhance the light shielding property in connection with the TFT 25 while reducing occurrence of troubles in the element substrate 2D, as with the fourth exemplary embodiment.

2. Electronic Apparatus

The electro-optical device 1 can be used in various electronic apparatuses.

Figure 20:
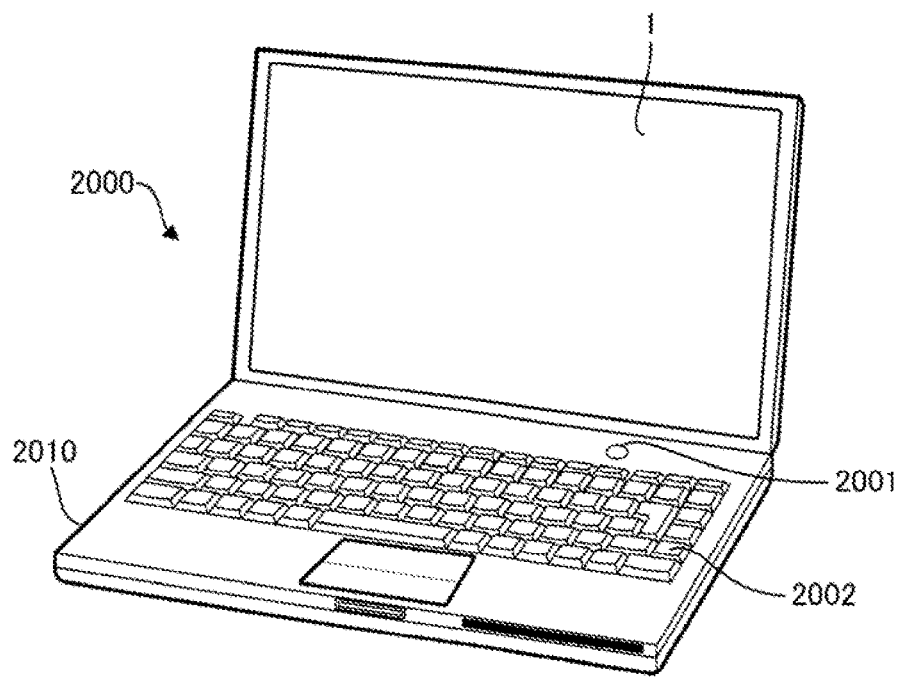
FIG. 20 is a perspective view illustrating a personal computer serving as one example of an electronic apparatus.

FIG. 20 is a perspective view illustrating a personal computer serving as one example of an electronic apparatus. The personal computer 2000 includes the electro-optical device 1 that displays various images, and a main body portion 2010 in which a power supply switch 2001 and a keyboard 2002 are provided.

Figure 21:
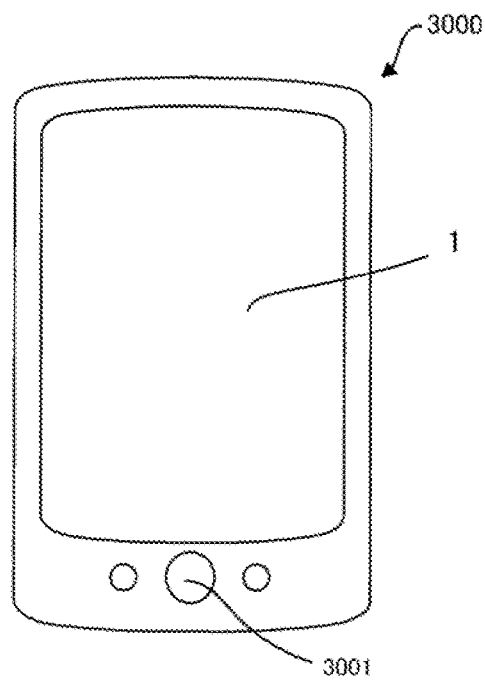
FIG. 21 is a perspective view illustrating a smartphone serving as one example of an electronic apparatus.

FIG. 21 is a perspective view illustrating a smartphone serving as one example of an electronic apparatus. A smartphone 3000 includes an operation input button 3001, and the electro-optical device 1 that displays various images. The content of screen displayed on the electro-optical device 1 changes in response to operation to the operation input button 3001.

Figure 22:
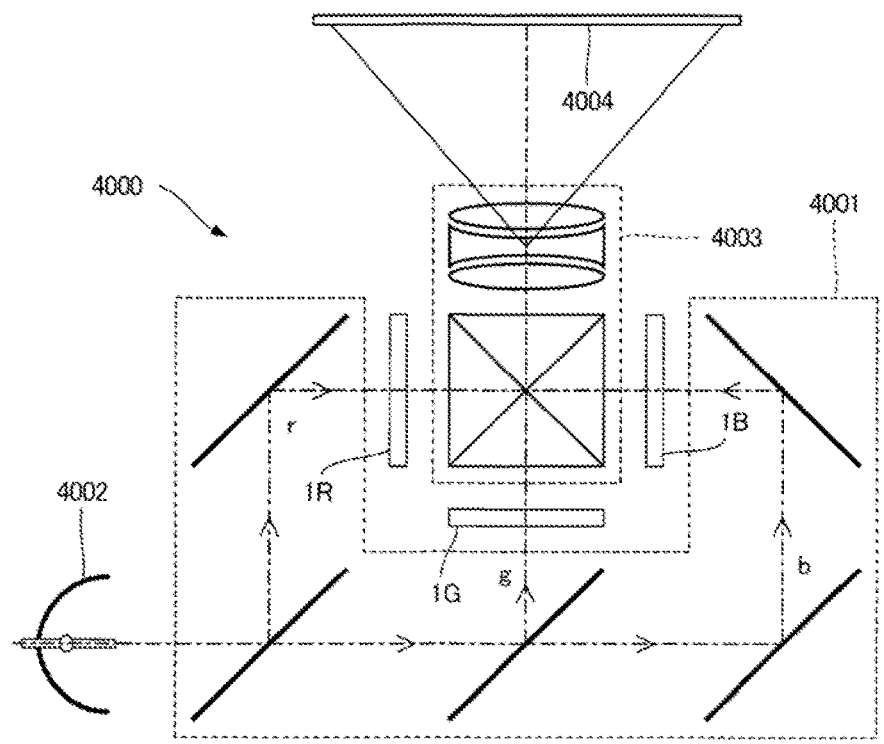
FIG. 22 is a schematic view illustrating a projector serving as one example of an electronic apparatus.

FIG. 22 is a schematic view illustrating a projector serving as one example of an electronic apparatus. A projection-type display device 4000 is, for example, a three-plate type projector. An electro-optical device 1R is an electro-optical device 1 that corresponds to a red display color. An electro-optical device 1G is an electro-optical device 1 that corresponds to a green display color. An electro-optical device 1B is an electro-optical device 1 that corresponds to a blue display color. In other words, the projection-type display device 4000 includes three electro-optical devices 1R, 1G, and 1B that correspond to a red display color, a green display color, and a blue display color, respectively.

An illumination optical system 4001 supplies the electro-optical device 1R with a red element r of light emitted from an illumination device 4002 serving as a light source, supplies a green element g to the electro-optical device 1G, and supplies a blue element b to the electro-optical device 1B. Each of the electro-optical devices 1R, 1G, and 1B functions as a light valve or other optical modulators that modulate each of the monochromatic lights in accordance with a display image, the monochromatic lights being supplied from the illumination optical system 4001. A projection optical system 4003 combines the light emitted from each of electro-optical devices 1R, 1G, and 1B, and projects the combined light to a projection surface 4004.

The personal computer 2000, the smartphone 3000, and the projection-type display device 4000 each include the above-described electro-optical device 1 exhibiting excellent quality. With the electro-optical device 1 being provided, it is possible to enhance the evenness of display of the personal computer 2000, the smartphone 3000, and the projection-type display device 4000. Thus, it is possible to enhance the quality of the personal computer 2000, the smartphone 3000, and the projection-type display device 4000.

Note that the electronic apparatus to which the present disclosure is applied is not limited to the devices described as examples, and includes, for example, a personal digital assistant (PDA), a digital still camera, a television, a video camera, a car navigation device, a display unit mounted on a vehicle, an electronic organizer, an electronic paper, a calculator, a word processor, a work station, a video phone, a point of sale (POS) terminal, and the like. In addition, the electronic apparatus to which the present disclosure is applied includes a printer, a scanner, a copy machine, a video player, an apparatus with touch screen, and the like.

These are descriptions of the electro-optical device and the electronic apparatus according to the present discloser based on preferred exemplary embodiments. However, the present disclosure is not limited to the exemplary embodiments described above. In addition, the configuration of each component of the present disclosure may be replaced with any configuration that exerts a function similar to that in the above-described exemplary embodiments, and any configuration or configurations may be added to the configuration of each components of the present disclosure.

Furthermore, in the description above, a liquid crystal device has been described as one example of the electro-optical device according to the present disclosure. However, the electro-optical device according to the present disclosure is not limited to this. In other words, it is only necessary that the electro-optical device according to the present disclosure is an electro-optical device of which optical properties change according to electric energy. For example, as with the exemplary embodiments described above, the present disclosure may be applicable to a display panel that employs a light-emitting element such as an organic electro luminescence (EL), an inorganic EL, and a light-emitting polymer.

Furthermore, as with the exemplary embodiments described above, the present disclosure may be applicable to an electrophoretic display panel that employs microcapsules containing colored liquid and white particles dispersed in the liquid.

Furthermore, in the description above, the TFT is used as one example of the switching element but the switching element is not limited to the TFT. For example, a metal-oxide-semiconductor field-effect transistor (MOSFET) or the like may be used.

Furthermore, the electro-optical device according to the present disclosure is not limited to being transmissive, and may be reflective.

What is claimed is:

1. An electro-optical device comprising:
   a substrate that is light-transmissive;
   a pixel electrode that is light-transmissive;
   a switching element comprising a gate electrode, a source electrode, and a drain electrode, the switching element being electrically coupled to the pixel electrode; and
   a light-shielding layer in contact with the substrate and overlapping, in a plan view from a thickness direction of the substrate, with the switching element, wherein
   the light-shielding layer includes:
      a first portion, and
      a second portion, the second portion having a thickness thicker than a thickness of the first portion,
   wherein the second portion is disposed, in the plan view from the thickness direction of the substrate, between the source electrode and the drain electrode.

2. The electro-optical device according to claim 1, wherein
   the substrate is provided with a recessed portion in which the light-shielding layer is disposed, the recessed portion opening to the switching element side.

3. The electro-optical device according to claim 2, wherein
   a surface of the substrate on the switching element side and a surface of the light-shielding layer on the switching element side form a planar surface.

4. The electro-optical device according to claim 1, wherein
   the light-shielding layer includes
      a metal film containing tungsten and
      a metal nitride film disposed between the metal film and the substrate, the metal nitride film containing tungsten nitride or titanium nitride.

5. The electro-optical device according to claim 4, wherein
   the light-shielding layer includes a tungsten silicide film disposed between the metal nitride film and the substrate, the tungsten silicide film containing tungsten silicide.

6. The electro-optical device according to claim 1, comprising:
   a circuit configured to drive the switching element; and
   a circuit light-shielding layer overlapping, in a plan view from a thickness direction of the substrate, with the circuit, wherein
   a thickness of the circuit light-shielding layer is thinner than the thickness of the second portion.

7. An electronic apparatus comprising the electro-optical device according to claim 1.

8. The electro-optical device according to claim 1, wherein in the plan view, the first portion comprises a longitudinal region, and the second portion comprises a rectangular region disposed within the longitudinal region.

* * * * *